United States Patent
Adams et al.

(10) Patent No.: US 6,681,350 B2
(45) Date of Patent: Jan. 20, 2004

(54) METHOD AND APPARATUS FOR TESTING MEMORY CELLS FOR DATA RETENTION FAULTS

(75) Inventors: R. Dean Adams, St. George, VT (US); Aneesha P. Deo, Endicott, NY (US); Kamran Zarrineh, Vestal, NY (US)

(73) Assignee: Cadence Design Systems, Inc., San Jose, CA (US)

( * ) Notice: Subject to any disclaimer, the term of this patent is extended or adjusted under 35 U.S.C. 154(b) by 448 days.

(21) Appl. No.: 09/681,602

(22) Filed: May 5, 2001

(65) Prior Publication Data

US 2002/0166086 A1 Nov. 7, 2002

(51) Int. Cl.[7] .......................... G11C 29/00; G11C 7/00; G11C 16/06
(52) U.S. Cl. ................... 714/718; 365/201; 365/185.25
(58) Field of Search ................................ 714/718, 719, 714/721, 734, 733, 735, 736, 724; 365/201, 203, 189.01, 185.25; 324/763, 765, 522, 523, 524, 209

(56) References Cited

U.S. PATENT DOCUMENTS

| | | | |
|---|---|---|---|
| 5,034,923 A | * | 7/1991 | Kuo et al. ............. 365/189.01 |
| 5,255,230 A | | 10/1993 | Chan et al. |
| 5,361,232 A | | 11/1994 | Petschauer et al. |
| 5,428,574 A | * | 6/1995 | Kuo et al. ................... 365/201 |
| 5,491,665 A | * | 2/1996 | Sachdev ..................... 365/201 |
| 5,733,032 A | | 3/1998 | Bolta et al. |
| 5,936,902 A | | 8/1999 | Hsu et al. |
| 6,378,102 B1 | * | 4/2002 | Watanabe et al. ........... 714/763 |

\* cited by examiner

*Primary Examiner*—Christine T. Tu
(74) *Attorney, Agent, or Firm*—Orrick, Herrington & Sutcliffe LLP

(57) ABSTRACT

A method for testing memory cells for data retention faults is disclosed. A first logical value is stored in a first cell, and a second logical value is stored in a second cell of a memory device. The second cell shares the same column with the first cell. The bitlines associated with the first and second cells are prevented from being precharged before the second cell can be read. After the second cell has been read repeatedly, the first cell is read, and the bitlines associated with the first and second cells are precharged. At this point, a data retention fault is determined to have occurred if the first cell does not contain the first logical value.

11 Claims, 4 Drawing Sheets

METHOD AND APPARATUS FOR TESTING MEMORY CELLS FOR DATA RETENTION FAULTS

BACKGROUND OF THE INVENTION

1. Technical Field

The present invention relates to a method and apparatus for testing logic circuits in general, and in particular to a method and apparatus for testing memory devices. Still more particularly, the present invention relates to a method and apparatus for testing memory cells for data retention faults.

2. Description of the Prior Art

Generally speaking, there are two types of faults that can occur in a cell array of a memory device, namely, parametric faults and functional faults. Functional faults can further be classified as coupling faults or single faults. Coupling faults are faults whereby a cell influences the behavior of another cell. Examples of coupling faults include inversion coupling faults, idempotent coupling faults, state coupling faults, linked coupling faults, etc. An inversion coupling fault involves two cells, one of which has its state inverted by a transition in the other cell. An idempotent fault also involves two cells, one of which is forced to a particular logic level by a transition write operation to the first cell. A state coupling fault is similar to inversion and idempotent coupling faults but differs in that the change in a cell results from some connection between two bitlines and not from a write transition. A linked coupling fault is when two or more coupling faults affect the same cell.

Single faults are faults that involve only a single cell. Single faults include stuck-at faults, stuck-open faults, transition faults, data retention faults, etc. A stuck-at fault occurs when the logic value of a cell is constant at a certain value, either zero or one.

A stuck-open fault is the inability of a cell to be accessed. A transition fault is the inability of a cell to undergo a zero to one transition or a one to zero transition. A data retention fault is the inability of a cell to maintain its logic level after some period of time.

Many static random access memory cells utilize a well-known six-transistor configuration, which includes a pull-up transistor on each side of the memory cell.

The advantage of a six-transistor configuration cell includes a higher operational stability and a higher alpha-particle immunity. One key disadvantage of a six-transistor configuration cell is, however, that certain open circuit failures in the pull-up or pull-down circuitry can appear as intermittent or soft failures. Because such faults do not result in a hard failure, testing and failure analysis have proven to be particularly difficult. Often times, extreme temperature cycling and sophisticated timing functions are employed during the manufacturing process, but still, not all defects can be detected.

By modelling such type of defects as data retention faults, the present invention provides an improved method and apparatus for detecting open circuit failures in the pull-up or pull-down circuitry of a six-transistor configuration cell.

BRIEF SUMMARY OF THE INVENTION

SUMMARY OF THE INVENTION

In accordance with a preferred embodiment of the present invention, a first logical value is stored in a first cell, and a second logical value is stored in a second cell of a memory device. The second cell shares a identical column with the first cell. The bitlines associated with the first and second cells are prevented from being precharged before the second cell can be read. After the second cell has been read repeatedly, the first cell is read, and the bitlines associated with the first and second cells are precharged. At this point, a data retention fault is determined to have occurred if the first cell does not contain the first logical value.

All objects, features, and advantages of the present invention will become apparent in the following detailed written description.

BRIEF DESCRIPTION OF THE SEVERAL VIEWS OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF THE INVENTION

DETAILED DESCRIPTION OF A PREFERRED EMBODIMENT

Figure 1:
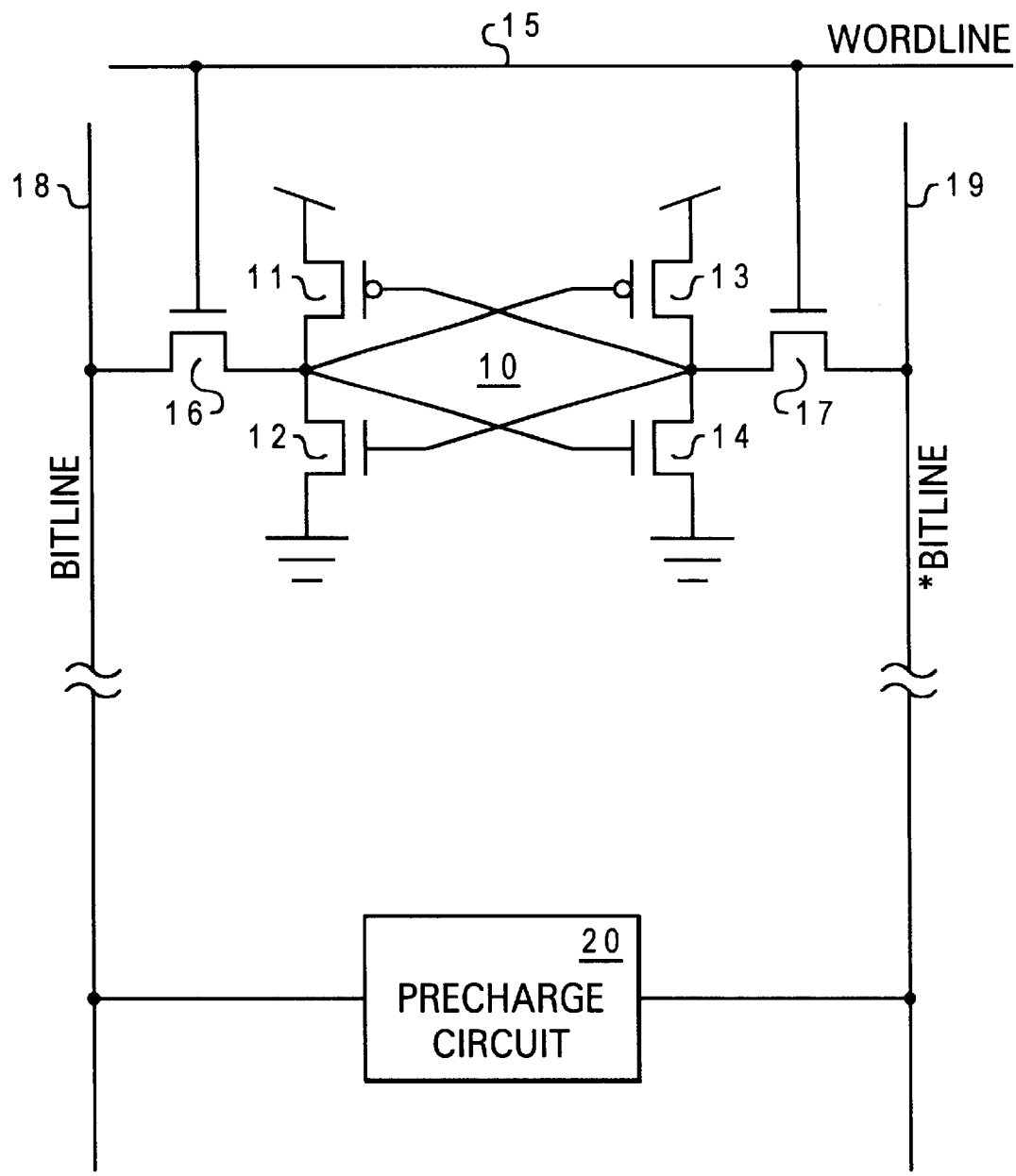
FIG. 1 is a circuit diagram of a memory cell to which a preferred embodiment of the present invention can be applied.

Referring now to the drawings and in particular to FIG. 1, there is depicted a circuit diagram of a memory cell to which a preferred embodiment of the present invention can be applied. As shown, a memory cell 10 includes transistors 11–17. By coupling the drain of transistor 12 to the gate of transistor 14 while the drain of transistor 14 to the gate of transistor 12, such transistor pair becomes the primary bi-stable device capable of storing a single bit of information. Complementary transistors 11 and 13 are similarly coupled to ensure that any change of state in the above-mentioned transistor pair will result in an equal and opposite state change. Such complementary state change greatly improves switching stability and guarantees that a switch from a logical one to a logical zero occurs at the same speed as a switch from a logical zero to a logical one.

Transistors 11 and 12 are connected in series between a power supply and ground. Similarly, transistors 13 and 14 are connected in series between the power supply and ground. However, because the gates of transistors 11 and 12 are coupled but complementary, only one of transistors 11 and 12 will be turned on during normal operations. Similarly, only one of transistors 13 and 14 will be turned on during normal operations.

The state of transistors 12, 14 (and transistors 11, 13) may be read or changed whenever a wordline 15 enables transistors 16 and 17. Transistor 16 couples a bitline 18 to the drains of transistors 11, 12 and the gates of transistors 13, 14. Similarly, transistor 17 couples a *bitline 19 to the drains of transistors 13, 14 and the gates of transistors 11, 12. Wordline 15 is also coupled to other memory cells at various bit positions, which are to be accessed together in parallel to produce an addressed word.

During a write operation, memory cell 10 is addressed (i.e., wordline 15 is enabled) such that bitline 18 and *bitline 19 are placed in complementary states.

Because transistors 16 and 17 are turned on, transistors 12, 14 (and also transistors 11, 13) are driven to the complementary states defined by bitline 18 and *bitline 19.

This may involve switching of the bi-stable or not depending upon whether its previous state was the same or different from that on bitline 18 and *bitline 19. Bitline 18 and *bitline 19 are also coupled to other memory cells within a column (i.e., at the same bit position).

Transistors 12, 14 along with transistors 11, 13 are similarly addressed during a read operation. However, during a read operation, bitline 18 and *bitline 19 are neutral and are permitted to source or sink current depending upon the state of transistors 12, 14 and transistors 11,13.

In order to improve read and write access speed, a precharge circuit 20 is used to initialize bitline 18 and *bitline 19 to a high state before a read operation. Such precharge overcomes some of the time penalty introduced by distributed capacitance within memory cell 10 because only bitline 18 or *bitline 19 needed to be discharged.

The result is a memory storage cell having rapid access times for both read/write operations and having considerable stability when switching from one state to another.

Transistors 11 and 13, which are commonly known as pull-up transistors, operate in conjunction with precharge circuit 20 to improve speed and stability. A short of either transistor 11 or 13 will be seen as a stuck-at fault. However, an open circuit or weak operation of either transistor 11 or 13 does not generally produce a hard failure.

Rather, an open circuit or weak operation of either transistor 11 or 13 reduces the stability of the memory cell, which may eventually lead to a loss of the stored state in memory cell 10. At the system level, an open circuit or weak operation of either transistor 11 or 13 may result in intermittent failures.

Transistors 12 and 14, which are commonly known as pull-down transistors, also operate in conjunction with precharge circuit 20 to improve speed and stability. Again, an open circuit or weak operation of either transistor 12 or 14 does not generally produce a hard failure. At the system level, an open circuit or weak operation of either transistor 12 or 14 also result in intermittent failures. In addition, a pull-down transistor with a resistive path to ground may not be able to discharge bitline 18 and *bitline 19 rapidly enough and the value stored in memory cell 10 may change to an opposite value.

Figure 2A:
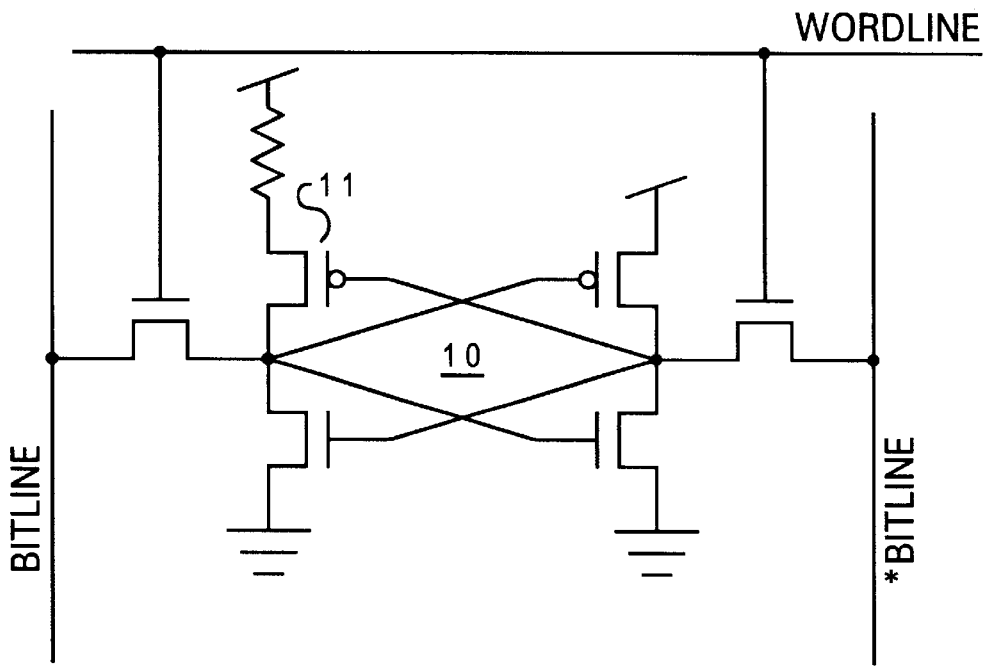
FIGS. 2a is a circuit diagram of a memory cell modelling a data retention defect in a pull-up transistor, in accordance with a preferred embodiment of the present invention.
Figure 2B:
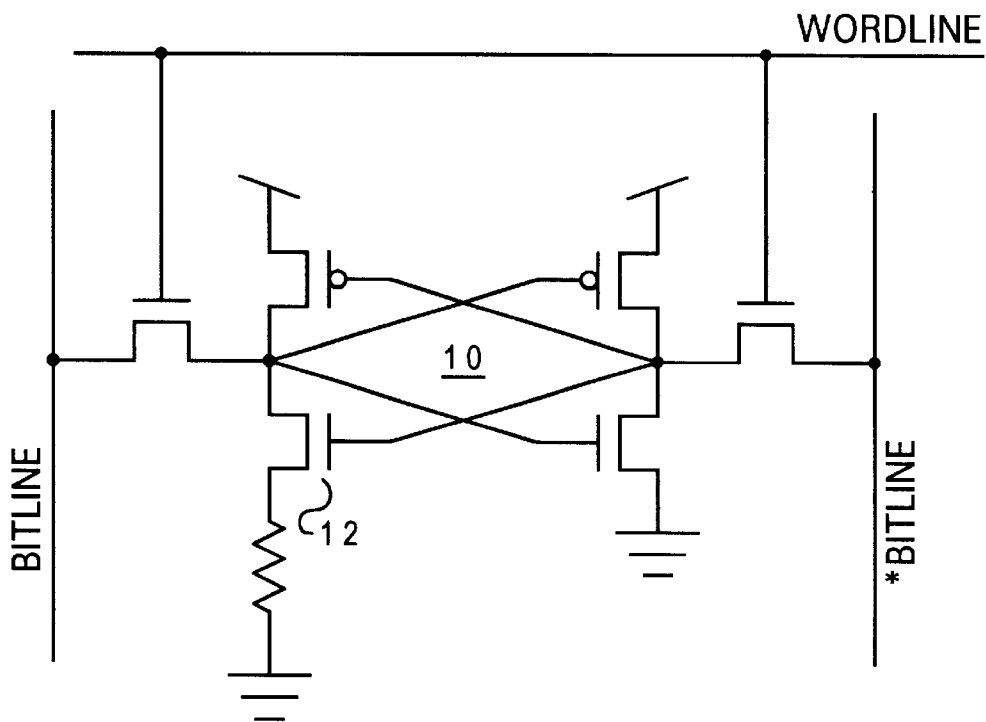
FIGS. 2b is a circuit diagram of a memory cell modelling a data retention defect in a pull-down transistor, in accordance with a preferred embodiment of the present invention.

The above-mentioned defects can be modelled as data retention faults, as shown in FIG. 2a for defects occurred in pull-up transistor 11, and in FIG. 2b for defects occurred in pull-down transistor 12. A data retention fault in a pull-down path can be detected by applying one or multiple consecutive read operations. Bitlines are typically precharged to a logical "1" prior to a read operation. Depending on the value stored in a memory cell, the pull-up transistor and the pull-down transistor from opposite sides are both turned on. When reading a memory cell, such as memory cell 10, the charged bitlines are connected to the memory cell. The pull-down transistor begins to discharge the bitlines that are connected to it. Such a scheme causes the pull-down transistor to remain turned on and prevents the pull-down transistor on the opposite side of the memory cell from turning on inadvertently.

Figure 3:
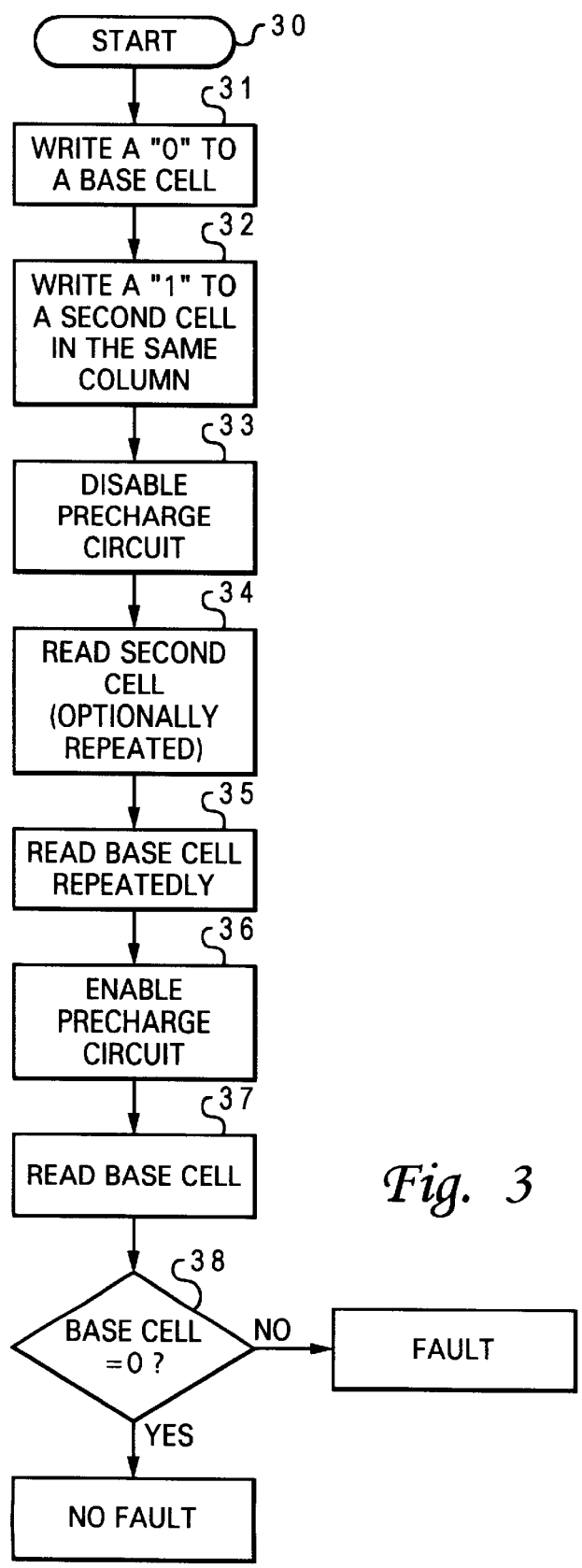
FIG. 3 is a high-level flow diagram of a method for testing memory cells for data retention faults, in accordance with a preferred embodiment of the present invention.

Referring now to FIG. 3, there is illustrated a high-level flow diagram of a method for testing memory cells for data retention faults, in accordance with a preferred embodiment of the present invention. Starting at block 30, a logical "0" is written to a base cell of a memory device, as shown in block 31. Then, a logical "1" is written to a second cell within the same column of the base cell, as depicted in block 32. Subsequently, the precharge circuit for the column of the two cells is turned off in order to prevent the bitlines associated to the column of the two cells from getting precharged, as illustrated in block 33.

Afterwards, the second cell having a logical "1" is read, for any number of times, as shown in block 34. Similarly, the base cell having a logical "0" is then read, for a number of times, as depicted in block 35. Then, the precharge circuit for the column of the two cells is turned back on again, as illustrated in block 36. At this point, the base cell is read, as shown in block 37. A determination is made as to whether or not the value read from the base cell equals zero, as depicted in block 38. The value read from the base cell should be a logical "0," as stored previously. Hence, a data retention fault is detected in the base cell if the read value is a logical "1." The steps as shown in block 31–38 are to be repeated for each cell within every column of the memory device. Afterwards, the same test is repeated with a complementary value. In other words, a logical "1" is written to the base cell, and a logical "0" is written to another cell within the same column of the base cell.

Figure 4:
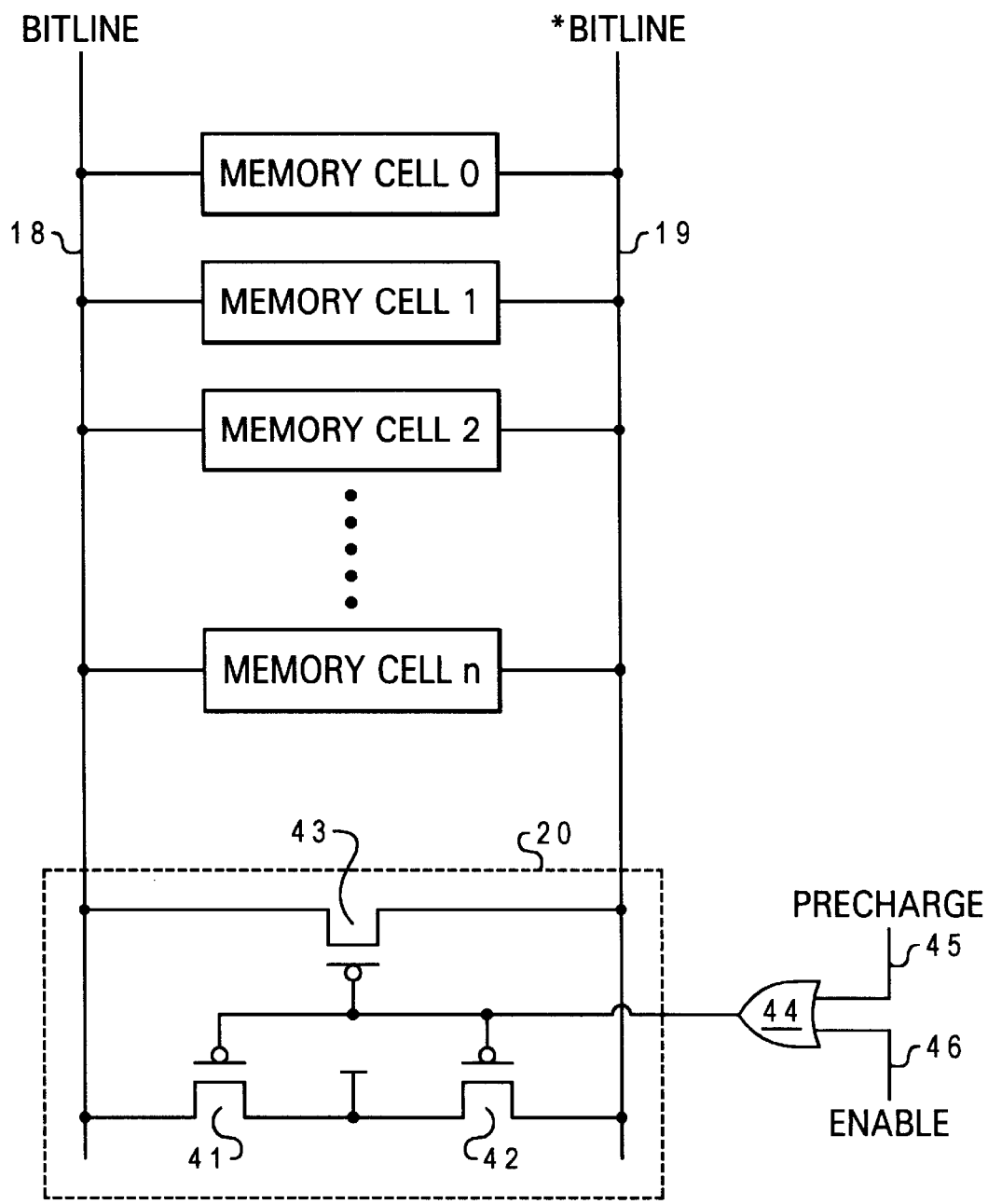
FIG. 4 is a circuit diagram of a precharge circuit along with a precharge enable control, in accordance with a preferred embodiment of the present invention.

With reference now to FIG. 4, there is illustrated a circuit diagram of a precharge circuit along with a precharge enable control, in accordance with a preferred embodiment of the present invention. As shown, precharge circuit 20 includes transistors 41–43 to initialize bitline 18 and *bitline 19. During normal operation, a precharge line 45 is commonly used to enable a precharge operation, as it is well-known in the art. With the present configuration in precharge circuit 20, precharge line 45 is active low. In other words, precharge operation will be performed on bitline 18 and *bitline 19 when precharge line 45 is low. In order to bypass the regular precharge cycle for the purpose of the present invention (specifically during the step shown in block 33 in FIG. 3), a precharge enable control is added in conjunction with precharge line 45. The precharge enable control includes a logical OR gate 44 that is controllable by an enable line 46. Because precharge line 45 is active low, enable line 46 can be asserted in order to by-pass the regular precharge cycle for the purpose of the present invention. It is understood by those skilled in the art that a logical NAND gate should be used instead of OR gate 44 if precharge line 45 is active high. In such a case, enable line 46 should be de-asserted in order to by-pass the regular precharge cycle.

As has been described, the present invention provides an improved method and apparatus for testing memory cells for data retention faults. The present invention can be implemented with a memory tester that can be programmed to shut off bitline precharge before a read operation. It is also important to note that although the present invention has been described in the context of a fully functional memory tester, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communications links.

While the invention has been particularly shown and described with reference to a preferred embodiment, it will be understood by those skilled in the art that various changes in form and detail may be made therein without departing from the spirit and scope of the invention.

What is claimed is:

1. A method for testing memory cells for data retention faults, said method comprising:

storing a first logical value in a first cell of a memory device;

storing a second logical value in a second cell of said memory device, wherein said second cell shares a same column with said first cell;

preventing bitlines associated with said first and second cells from being precharged;

reading said second cell repeatedly followed by a read of said first cell;

precharging said bitlines associated with said first and second cells; and detecting a data retention fault has occurred if said first cell does not contain said first logical value.

2. The method of claim 1, wherein said first logical value is a "0" and said second logical value is a logical "1."

3. The method of claim 1, wherein said first logical value is a "1" and said second logical value is a logical "0."

4. The method of claim 1, wherein said preventing step further includes a step of preventing said bitlines associated with said first and second cells from being precharged via a logical OR gate or a logical NAND gate.

5. A memory tester for testing memory cells for data retention faults, said memory tester comprising:

means for storing a first logical value in a first cell of a memory device;

means for storing a second logical value in a second cell of said memory device, wherein said second cell shares a same column with said first cell;

means for preventing bitlines associated with said first and second cells from being precharged;

means for reading said second cell repeatedly followed by a read of said first cell;

means for precharging said bitlines associated with said first and second cells; and means for detecting a data retention fault has occurred if said first cell does not contain said first logical value.

6. The memory tester of claim 5, wherein said first logical value is a "0" and said second logical value is a logical "1."

7. The memory tester of claim 5, wherein said first logical value is a "1" and said second logical value is a logical "0."

8. The memory tester of claim 5, wherein said preventing means further includes a logical OR gate or a logical NAND gate.

9. A computer program product for testing memory cells for data retention faults, said computer program product comprising:

program code means for storing a first logical value in a first cell of a memory device;

program code means for storing a second logical value in a second cell of said memory device, wherein said second cell shares a same column with said first cell;

program code means for preventing bitlines associated with said first and second cells from being precharged;

program code means for reading said second cell repeatedly followed by a read of said first cell;

program code means for precharging said bitlines associated with said first and second cells; and program code means for detecting a data retention fault has occurred if said first cell does not contain said first logical value.

10. The computer program product of claim 9, wherein said first logical value is a "0" and said second logical value is a logical "1."

11. The computer program product of claim 9, wherein said first logical value is a "1" and said second logical value is a logical "0."

* * * * *